United States Patent
Furuta et al.

[11] Patent Number: 6,124,004
[45] Date of Patent: Sep. 26, 2000

[54] LAMINATE OF LIQUID CRYSTAL POLYESTER RESIN COMPOSITION

[75] Inventors: Motonobu Furuta, Chiba; Takanari Yamaguchi, Tsukuba, both of Japan

[73] Assignee: Sumitomo Chemical Company, Limited, Osaka, Japan

[21] Appl. No.: 09/040,997

[22] Filed: Mar. 19, 1998

[30] Foreign Application Priority Data

| Mar. 19, 1997 | [JP] | Japan | 9-066381 |
| Mar. 21, 1997 | [JP] | Japan | 9-068424 |
| May 29, 1997 | [JP] | Japan | 9-140003 |

[51] Int. Cl.$^7$ .................... C09K 19/00
[52] U.S. Cl. ............ 428/1.1; 156/244.11; 156/244.24; 428/1.6; 428/1.62; 428/480; 428/901; 524/539
[58] Field of Search .............. 428/1, 480, 901, 428/1.1, 1.6, 1.62; 524/539; 156/244.11, 244.24

[56] References Cited

U.S. PATENT DOCUMENTS 5,268,414  12/1993  Nakai ........................ 524/539
5,692,940  12/1997  Kinbara ...................... 442/408

FOREIGN PATENT DOCUMENTS 734851A  10/1996  European Pat. Off. .
737707A  10/1996  European Pat. Off. .
790279A   8/1997  European Pat. Off. .

*Primary Examiner*—Nasser Ahmad

[57] ABSTRACT

A laminate comprising a metallic foil and a layer made of a liquid crystal polyester resin composition comprising a liquid crystal polyester(A) as a continuous phase and rubber (B) having a functional group reactive with the liquid crystal polyester as a dispersed phase. The laminate has excellent flexibility and electric properties, and additionally is cheap, therefore, suitable as a print wiring board. The laminate comprising a metallic foil, a layer made of a liquid crystal polyester resin composition and a layer made of a fiber material of the present invention has an excellent heat resistance, a low relative dielectric constant and a low dielectric loss tangent, an excellent appearance, and additionally, the laminate can be produced in an industrially inexpensive and simple manner. The laminate can be widely used in the industrial field for electric and electronic parts, precision parts and the like.

21 Claims, 1 Drawing Sheet

LAMINATE OF LIQUID CRYSTAL POLYESTER RESIN COMPOSITION

BACKGROUND OF THE INVENTION

1. Field of the Invention

The present invention relates to a laminate obtained by laminating a film made of a liquid crystal polyester resin composition and a metallic foil, having excellent molding processability, heat resistance and flexibility, and excellent adhesion between layers.

Further, the present invention relates to a laminate comprising a layer made of a liquid crystal polyester resin composition and a layer made of a fiber material, and a laminate comprising a metallic foil, a layer made of a liquid crystal polyester resin composition and a layer made of a fiber material, and relates to a laminate which has excellent heat resistance, and low relative dielectric constant, dielectric loss tangent and water absorption, and additionally which is cheap, used for electric and electronic parts, circuit and multi-layered substrates, and the like.

2. Description of the Related Art

Recently, with commercial requirements for light-weight electric and electronic parts and low cost parts, demand is drastically increasing for a flexible printed-wiring board composed of a laminated material made of a resin film, a metallic foil, and a film carrier tape. Therefore, laminated materials made of a thermosetting resin film such as an epoxy resin and a metallic foil have been developed, however, they have problems of poor productivity and high expense.

Furthermore, a laminate comprising a glass fiber textile impregnated with an epoxy resin, a polyimide resin layer and a metallic foil, is widely used in the industry as a multi-layered substrate, however, since the dielectric constant of the substrate is high and production process thereof is complicated, it is very expensive.

As the laminated material composed of a thermoplastic resin film and a metallic foil, Japanese Patent KOKOKU Publication (JP-B) No. 59-46786 discloses a method for obtaining a printed-wiring board by press-bonding a polyethyleneterephthalate (hereinafter, sometimes referred to as PET) film with a metallic foil. However, thus obtained printed-wiring board has insufficient heat resistance since PET has low heat resistance.

Japanese Patent KOKAI publication (JP-A) No.61-130041 describes a method for obtaining a laminated material for a printed-wiring board by molding of a liquid polymer film and a metal film using a press machine, and JP-A-2-252738, U.S. Pat. No. 496,807, JP-A-3-183185, JP-A-5-042603 and the like describe a method for obtaining a liquid polymer film for a printed-wiring board, or a method for obtaining a printed-wiring board laminate by press-bonding of a liquid crystal polymer film with a metal film with heating, and the like. Further, JP-B-8-2611 describes a laminate in which a liquid crystal polyester layer exists between metal plates, U.S. Pat. No. 5,360,647 and JP-A-4-53739 and the like disclose a laminated composed of a metal sheet and a liquid crystal polyester. However, the printed-wiring board using a liquid crystal polymer has various problems in that it is difficult to process a liquid crystal polymer into a film by a general method. Since it has poor film-forming processability, film deformation occurs since it has high anisotropy, and a flexible printed-wiring board can not be obtained since the liquid crystal polymer film has high stiffness, and the like.

JP-A-8-323923 describes a laminated material composed of a metallic foil and a film of a liquid crystal polyester resin composition comprising a liquid crystal polyester and a specific thermoplastic resin. However, it has problems that the appearance of the films is poor and adhesion between layers is insufficient.

Regarding a laminate using fiber material, for example, JP-A-62-11289 discloses a technique using an Aramid fiber instead of a glass fiber, however, in this case, there are problems that the Aramid fiber has high dielectric constant, and has water absorbing property. U.S. Pat. No. 4,975,312 discloses a multi-layered substrate using a biaxially-oriented liquid crystal polymer film, glass fiber and epoxy reinforcing material, however, the liquid crystal polymer film can not be formed as a thin film, and has insufficient physical properties. JP-A-2-175731 discloses a method in which an epoxy resin having low relative dielectric constant is impregnated into glass fiber, and the resulting resin material is used in a multi-layered substrate where, however, the effect is not sufficient. JP-A-62-283694, JP-A-8-157621 and the like disclose a method in which a porous sheet made of Teflon is impregnated with a thermosetting resin and the resulting sheet material is used as a prepreg. However, it is very expensive or has insufficient physical properties. Therefore, a laminate which has excellent heat resistance, and low relative dielectric constant, dielectric loss constant and water absorption, and which is also cheap has eagerly been commercially desired.

SUMMARY OF THE INVENTION

Under these circumstances, an object of the present invention is to solve the various above-described problems, and to provide a cheap laminate which has excellent heat resistance, flexibility and film-forming processability, and additionally excellent adhesion between layers. Further, the present invention provides a laminate which has excellent heat resistance, and low relative dielectric constant, dielectric loss constant and water absorption, excellent appearance, and which is also cheap.

That is, the present invention relates to a laminate comprising a metallic foil and a layer made of a liquid crystal polyester resin composition comprising a liquid crystal polyester(A) as a continuous phase and rubber(B) having a functional group reactive with the liquid crystal polyester as a dispersed phase.

Also, the present invention relates to a laminate comprising a layer made of a liquid crystal polyester resin composition comprising a liquid crystal polyester(A) as a continuous phase and rubber(B) having a functional group reactive with the liquid crystal polyester as a dispersed phase, and a layer made of a fiber material containing an organic fiber material and/or an inorganic fiber material, and a laminate comprising a metallic foil, a layer made of a liquid crystal polyester resin composition comprising a liquid crystal polyester(A) as a continuous phase and rubber(B) having a functional group reactive with the liquid crystal polyester as a dispersed phase, and a layer made of a fiber material containing an organic fiber material and/or an inorganic fiber material.

Figure 1:
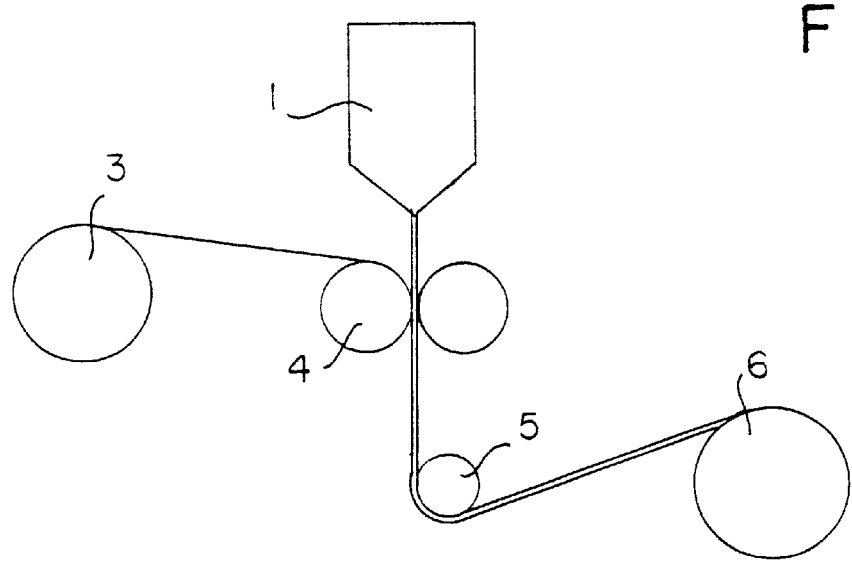
FIG. 1 is a schematic view of the apparatus used in Example 4 and Comparative Example 4.

1: T die
2: Woven fabric or non-woven fabric made of fiber material
3: Copper foil
4: Metal roll
5: Metal roll
6: Winding machine roll

DETAILED DESCRIPTION OF THE INVENTION

A liquid crystal polyester used as the component (A) of a liquid crystal polyester resin composition of the present invention is a polyester called "thermotropic liquid crystal polymer".

Examples of the component (A) include:

(1) those comprising a combination of an aromatic dicarboxylic acid, an aromatic diol, and an aromatic hydroxycarboxylic acid;
(2) those comprising a combination of aromatic hydroxycarboxylic acid of different kinds;
(3) those comprising a combination of an aromatic dicarboxylic acid and a nuclear-substituted diol; and
(4) those obtainable by the reaction of a polyester such as polyethylene terephthalate with an aromatic hydroxycarboxylic acid;

which form an anisotropic molten product at a temperature of 400° C. or lower. Further, in place of the aromatic dicarboxylic acid, the aromatic diol, or the aromatic hydroxycarboxylic acid, derivatives thereof having ester formation property can be used.

Examples of repeating units of the liquid crystal polyesters are shown below, however, they are not limited thereto.

A repeating unit derived from an aromatic dicarboxylic acid:

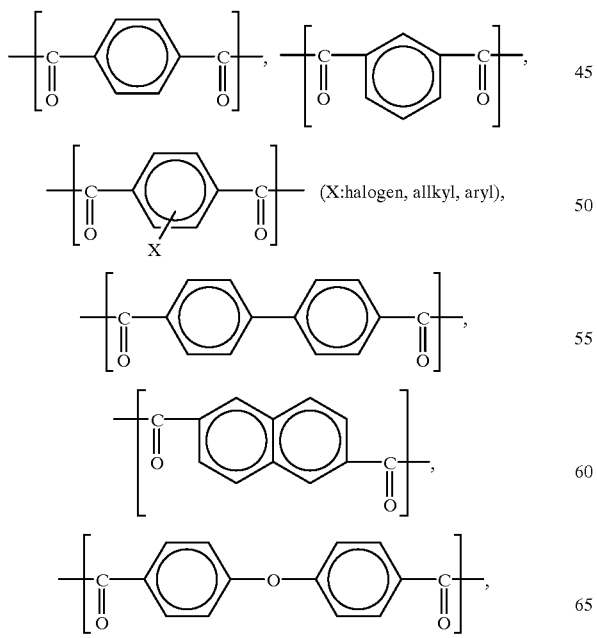

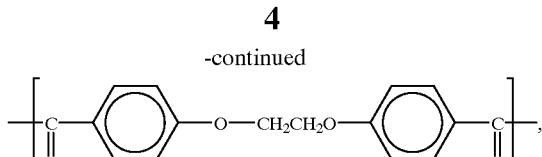

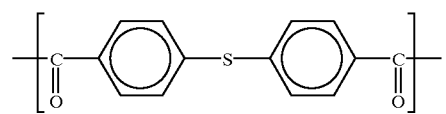

A repeating unit derived from an aromatic diol:

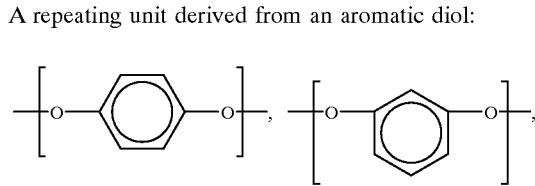

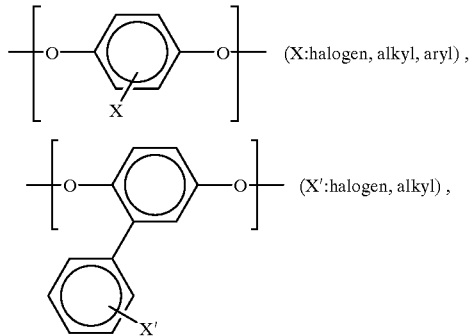

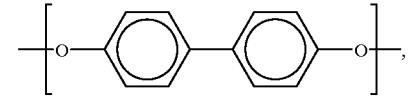

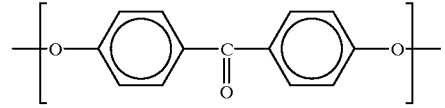

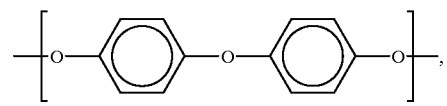

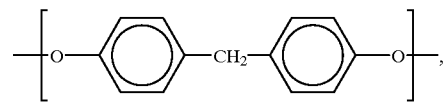

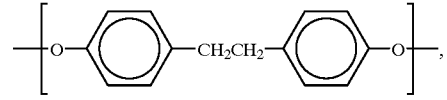

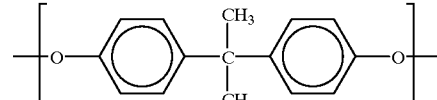

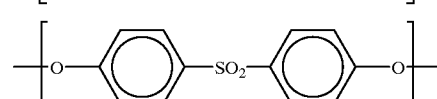

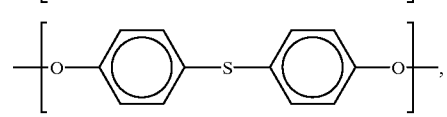

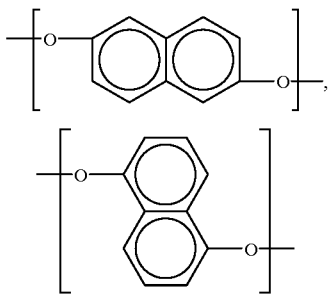

A repeating unit derived from an aromatic hydroxycarboxylic acid:

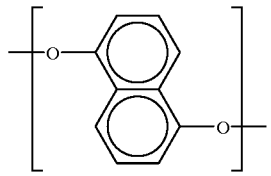

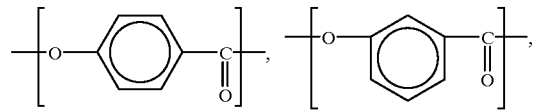 (X':halogen, alkyl),

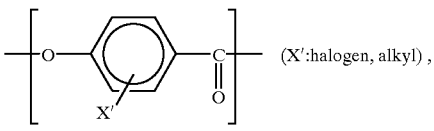

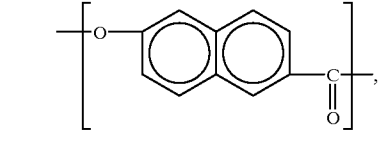

Liquid crystal polyesters including a repeating unit:

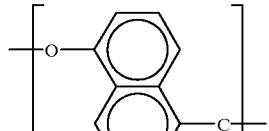

are particularly preferable in heat resistance, mechanical properties, and processability, and those including at least 30 mole % of the repeating unit are further preferable.

Specific examples of combination of repeating units are shown below.

(I)

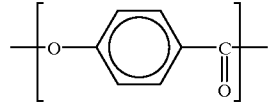

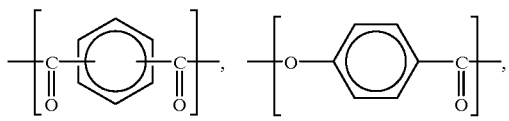

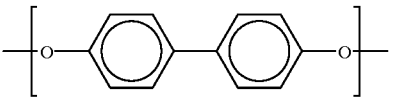

(II)

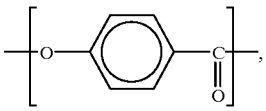

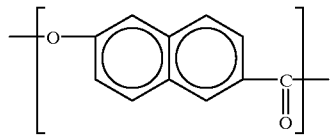

(III)

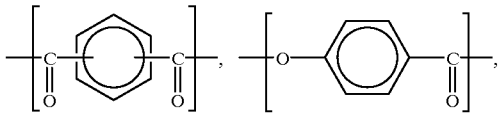

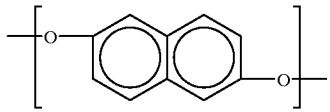

(IV)

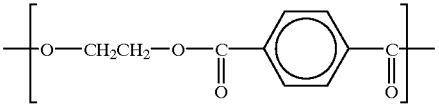

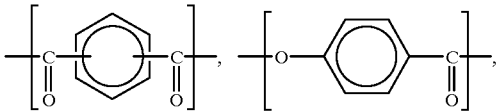

(V)

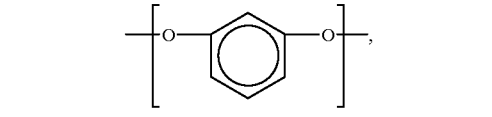

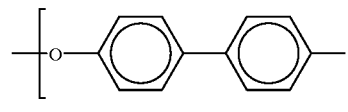

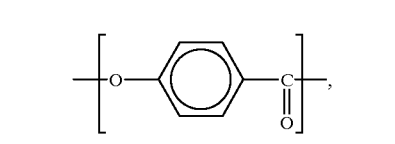

(VI)

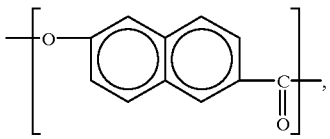

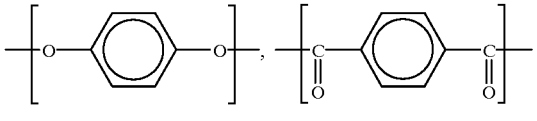

Production methods of the above-mentioned liquid crystal polyesters (I) to (VI) are disclosed in Japanese Patent KOKOKU Publication Nos. 47-47870, 63-3888, 63-3891, 56-18016, and Japanese Patent KOKAI Publication No 2-51523.

Among these examples of combination, (I), (II), and (IV) are preferable, and (I) and (II) are more preferable.

In the liquid crystal polyester resin compositions of the present invention, a liquid crystal polyester as an (A) component comprising 30 to 80 mole % of the below-mentioned repeating unit (a'), 0 to 10 mole % of the below-mentioned repeating unit (b'), 10 to 25 mole % of the below-mentioned repeating unit (c'), and 10 to 35 mole % of the below-mentioned repeating unit (d') is preferably used in the invention in the field where a high heat resistance is required.

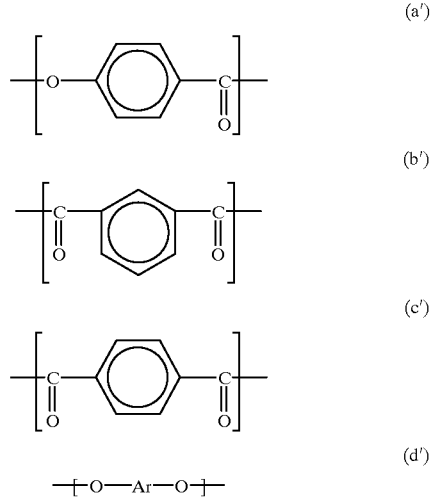

In the formulae, Ar denotes a divalent aromatic group.

In the liquid crystal polyester resin compositions, a component (B) is a rubber having a functional group reactive with a liquid crystal polyester of component (A).

A "rubber" herein corresponds to a polymer having rubber elasticity at room temperature disclosed in the New Edition Polymer Dictionary (compiled by the Polymer Society, published in 1988 by Asakura Shoten). Examples thereof include natural rubber, butadiene polymer, butadiene-styrene copolymer (including random copolymer, block copolymer (including SEBS rubber and SBS rubber), and graft copolymer), or hydrogenated products thereof, isoprene polymer, chlorobutadiene polymer, butadiene-acrylonitrile copolymer, isobutylene polymer, isobutylene-butadiene copolymer, isobutylene-isoprene copolymer, acrylate-ethylene containing copolymer rubber, ethylene-propylene copolymer rubber, ethylene-butene copolymer rubber, ethylene-propylene-styrene copolymer rubber, styrene-isoprene copolymer rubber, styrene-butylene copolymer, styrene-ethylene-propylene copolymer rubber, perfluorinated rubber, fluorinated rubber, chloroprene rubber, butyl rubber, silicone rubber, ethylene-propylene-nonconjugated diene copolymer rubber, thiol rubber, polysulfide rubber, polyurethane rubber, polyether rubber (such as polypropylene oxide), epichlorohydrin rubber, polyester elastomer, and polyamide elastomer. Among these examples, acrylate-ethylene copolymer is preferable, and (meth)acrylate-ethylene copolymer rubber is further preferable.

These rubber-like materials can be produced in any production method such as an emulsion polymerization method and a solution polymerization method, with any catalyst such as trialkylaluminum, lithium halide and nickel containing catalyst.

Rubbers (B) of the present invention include the above-mentioned rubbers, having a functional group reactive with a liquid crystal polyester (A).

Examples of a functional group reactive with the liquid crystal polyester include an epoxy group, an oxazolyl group, and an amino group. Among these examples, an epoxy group is preferable. Among functional groups having an epoxy group, a glycidyl group is preferable.

In a rubber (B) of the present invention, the method of introducing a functional group reactive with a liquid crystal polyester into the rubber is not particularly limited but a known method can be used. For example, it is possible to introduce a monomer having the functional group by copolymerization in a synthetization stage of a rubber, or it is also possible to graft copolymerize a rubber and a monomer having the functional group.

Among monomers having a glycidyl group, unsaturated carboxylic acid glycidyl ester and unsaturated glycidyl ether are preferably used. Examples of the rubber(B) having a functional group reactive with the liquid crystal polyester include a copolymer rubber having an unsaturated carboxylic acid glycidyl ester unit or an unsaturated glycidyl ether unit.

An unsaturated carboxylic acid glycidyl ester is a compound represented by the general formula,

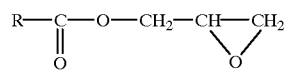

in the formula, R denotes a hydrocarbon group having 2 to 13 carbon atoms with an ethylene type unsaturated bond.

An unsaturated glycidyl ether is a compound represented by the general formula,

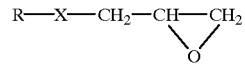

in the formula, R denotes a hydrocarbon group having 2 to 18 carbon atoms with an ethylene type unsaturated bond, and X denotes —CH2—O— or

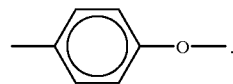

Examples of unsaturated carboxylic acid glycidyl ester include glycidyl acrylate, glycidyl methacrylate, itaconic acid diglycidyl ester, butene tricarboxylic acid triglycidyl ester and p-styrene carboxylic acid glycidyl ester.

Examples of unsaturated glycidyl ether include vinyl glycidyl ether, allyl glycidyl ether, 2-methylally glycidyl ether, methacryl glycidyl ether and styrene-p-glycidyl ether.

That is, preferable examples of rubbers having a functional group reactive with a liquid crystal polyester (B) of the present invention include (meth)acrylate-ethylene-unsaturated carboxylic acid glycidyl ester and/or unsaturated glycidyl ether copolymer rubber.

(Meth)acrylate is an ester obtained from acrylic acid or methacrylic acid and alcohol. As alcohol, alcohol having 1 to 8 carbon atoms is preferable. Examples of (meth)acrylate include methyl acrylate, methyl methacrylate, n-butyl acrylate, n-butyl methacrylate, tert-butyl acrylate, ter-butyl methacrylate, 2-ethyl hexyl acrylate, and 2-ethyl hexyl methacrylate. These (meth)acrylates can be used alone or in combination of two or more.

The above-mentioned (meth)acrylate-ethylene-unsaturated carboxylic acid glycidyl ester and/or unsaturated glycidyl ether copolymer rubber can be produced in an ordinary method, such as bulk polymerization, emulsion polymerization and solution polymerization with a free radical initiator. An representative polymerization method is disclosed in the Japanese Patent Publication No. 46-45085 and JP-A-61-127709. That is, production can be conducted in the conditions of a 500 kg/cm2 or more pressure, 40 to 300° C. temperature in the presence of a polymerization initiator capable of generating a free radical.

The component ratio of the above-mentioned (meth)acrylate-ethylene-unsaturated carboxylic acid glycidyl ester and/or unsaturated glycidyl ether copolymer rubber is preferably more than 40 but less than 97% by weight, more preferably 45 to 70% by weight of (meth)acrylate, preferably more than 3 but less than 50% by weight, more preferably 10 to 49% by weight of an ethylene unit, and preferably more than 0.1 but less than 30% by weight, more preferably 0.5 to 20% by weight of an unsaturated carboxylic acid glycidyl ester and/or unsaturated glycidyl ether unit.

If the ratio of (meth)acrylate is more than 40% by weight, the rubber elasticity is good and the impact resistance improvement effect of the composition is sufficient. If the ratio is less than 97% by weight, the embrittlement point of the copolymer rubber becomes lower, and the mechanical properties of the composition at a low temperature is sufficient, and thus preferable.

Besides, if the ratio of unsaturated carboxylic acid glycidyl ester and/or unsaturated glycidyl ether is less than 0.1% by weight, film forming property of the liquid crystal polyester resin composition lowers, and on the other hand, if the ratio is more than 30% by weight, mechanical property of the composition lowers, and thus neither is preferable.

The mooney viscosity of the above-mentioned rubber (B) is 3 to 70, preferably 3 to 30, more preferably 4 to 25. The "Mooney viscosity" herein denotes a value measured by a 100° C. large rotor according to JIS K6300.

A rubber (B) of the present invention has preferably a heat of fusion of less than 6 J/g, more preferably 3 J/g. If the heat of fusion is not less than 6 J/g, a film of good appearance cannot be obtained and adhesiveness with metallic foil is sometimes inferior, and it is not preferable.

A rubber (B) of the present invention can be vulcanized as needed, and can be used as a vulcanized rubber. Vulcanization can be achieved by the use of a polyfunctional organic acid, a polyfunctional amine compound, or an imidazole compound. But vulcanization methods are not limited thereto.

In a preferable embodiment of a liquid crystal polyester resin composition of the present invention, a liquid crystal polyester of a component (A) is in a continuous phase, and a rubber of a component (B) is in a dispersed phase. Unless the component (A) is in a continuous phase, the gas barrier property drastically deteriorates and heat resistance and mechanical properties become insufficient, and thus it is not preferable.

The ratio of a component (A) and a component (B) in a liquid crystal polyester resin composition used in the present invention is 56.0 to 99.9% by weight, preferably 65.0 to 99.9% by weight, more preferably 70 to 98% by weight of the component (A) and 44.0 to 0.1% by weight, preferably 35.0 to 0.1% by weight, more preferably 30 to 2% by weight of the component (B).

If the ratio of the component (A) is less than 56% by weight, heat resistance of the composition lowers, and thus it is not preferable. Further, if the ratio of the component (A) is more than 99.9% by weight, the improvement effect of film formation of the composition may not be sufficient, besides, the production cost becomes higher, and thus it is not preferable.

Production methods of a liquid crystal polyester resin composition of the present invention are not particularly limited and a known method can be used. For example, a method of mixing components in a solution state, then evaporating the solvent or precipitating in the solvent can be utilized. From the industrial point of view, a method of kneading components in a molten state is preferable. For melt kneading, ordinary kneading machines such as a single-screw extruder, a twin-screw extruder and various kinds of kneaders can be used. In particular, a twin-screw high kneader is preferable.

At the time of melt kneading, a cylinder setting temperature of a kneading machine is preferably in the range of 200 to 360° C., more preferably in the range of 230 to 350° C.

At the time of kneading, components may be preliminarily mixed with a device such as a tumbler or a Henschel mixer, or may be supplied individually in certain amount to a kneading machine without preliminary mixing.

An inorganic filler may be used optionally in a liquid crystal polyester resin composition used in the present invention. Examples of inorganic fillers include calcium carbonate, talc, clay, silica, magnesium carbonate, barium sulfate, titanium oxide, alumina, gypsum, glass flake, glass fiber, carbon fiber, alumina fiber, silica alumina fiber, aluminum borate whisker and potassium titanate fiber.

Various kinds of additives may be further added to a liquid crystal polyester resin composition used in the present invention during a production or a processing thereafter as needed. Examples of the additives include an organic filler, an antioxidant, a heat stabilizer, a light stabilizer, a flame retarder, a lubricant, an antistatic agent, an inorganic or organic coloring agent, a rust proof agent, a crosslinking agent, a foaming agent, a fluorescent, a surface smoother, a surface brighter, a mold releasing agent such as a fluorine resin.

The kneaded resin composition is molded by various kinds of molding methods such as injection molding and protrusion molding. However, it is also possible to have a resin composition of the present invention without having a preliminary kneading process, but by dry blending at the time of molding or kneading during the melting processing operation to have a film directly.

As a method of the film formation of the above-mentioned resin compositions, in general, a liquid crystal polyester resin composition film can be obtained by kneading a liquid crystal polyester resin composition with an extruder. and winding up the molten resin extruded through a T die.

In a film formation using a T die, a liquid crystal polyester resin composition kneaded in a molten state with an extruder passes through a T die, usually arranged upside down, to become a sheet-like product, and then passes through a compressing roll and is rolled up in a longitudinal direction with a drawing device.

In any method, a film formation temperature is preferably in the range of from a temperature lower than the flow temperature of the liquid crystal polyester resin composition by 60° C. to a temperature higher than the flow temperature by 60° C. Film formation processing is conducted more preferably in the range of from the flow temperature to a temperature higher than the flow temperature by 30° C.

Setting conditions of an extruder in such a film formation can be optionally selected according to the composition. A setting temperature of the cylinder of an extruder is preferably in the range of 200 to 360° C., more preferably 230 to 350 ° C. Since a temperature outside the range may cause heat decomposition of the composition or difficulty in film formation, it is not preferable.

A die gap of a T die is preferably 0.2 to 2.0 mm, and more preferably 0.2 to 1.2 mm.

A draft ratio of a liquid crystal polyester resin composition film of the present invention is in the range of 1.1 to 40, preferably 10 to 40, and more preferably 15 to 35.

The term draft ratio herein refers to an amount of sectional area of the slit of T-die divided by sectional area crossing the machine direction of the film. If the draft ratio is less than 1.1, the strength of the film is insufficient and if the draft ratio exceeds 45, the surface smoothness may be insufficient. The draft ratio can be adjusted by controlling the conditions of the extruder and rate of winding up.

Also a two-axis drawn film of the resin composition extruded from the T die can be obtained similarly to the single-axis drawn film. That is, the setting temperature of the cylinder of an extruder is preferably in the range of 200 to 360° C., more preferably 230 to 350° C., and the die gap of a T die is preferably 0.2 to 2.0 mm, and more preferably 0.2 to 1.2 mm.

Concrete examples of two-axis drawing include a consecutive drawing comprising single-axis drawing of a molten product of a composition of the present invention extruded from a T die of an extruder in the MD direction (machine direction) and drawing in the TD direction (perpendicular to machine direction), a simultaneous drawing comprising drawing a sheet extruded from a T die in both the MD and TD directions simultaneously, and a consecutive or simultaneous drawing of an undrawn sheet extruded from a T die with a twin-screw extruder or a tenter.

In the two-axis drawing, the drawing ratio is preferably 1.2–20 in the MD direction and 1.2–20 in the TD direction. If the drawing ratio is out of the above range, the strength of the film is insufficient or the surface smoothness may be insufficient.

In the case of an inflation molding (film formation), the liquid crystal polyester resin composition is supplied to an extruder equipped with a die having a ring-like slit. Then the composition is melt-kneaded at a cylinder setting temperature of 200 to 360° C., preferably 230 to 350 ° C., and the molten resin is extruded from the ring-like slit as a tube-like film to the upper direction or the lower direction. Die gap of a ring-like slit is, in general, 0.1 to 5 mm, preferably 0.2 to 2 mm, and a diameter of the ring-like slit is, in general, 20 to 1,000 mm, preferably 25 to 600 mm.

To the extruded tube-like molten resin film, by applying a draft in the machine direction (MD) as well as injecting air or an inert gas such as a nitrogen gas inside the tubular film, the expansion drawing of the film in the direction perpendicular to the machine direction (TD) can be achieved.

In the inflation film formation of a liquid crystal polyester resin composition of the present invention, a preferable blow ratio is 1.5 to 10, and a preferable MD drawing ratio is 1.5 to 40.

If the condition in the inflation film formation is not in the above-mentioned range, it is difficult to obtain a liquid crystal polyester resin composition film having an even thickness and excellent strength without a wrinkle, and thus it is not preferable.

After air-cooling or water-cooling of the perimeter, the expanded film passes through a nip roll and is rolled up.

In the inflation film formation, conditions can be selected optionally for achieving the expansion of a tube-like molten product film to have an even thickness and surface smoothness depending upon the composition of a liquid crystal polyester resin composition.

A film thickness of a liquid crystal polyester resin composition film obtained by the present invention is not particularly limited, but it is preferably 3 to 1000 μm, more preferably 3 to 200 μm.

Examples of the metallic foil used in the present invention include simple metals such as gold, silver, copper, nickel, aluminum, tin, chromium, titanium, zinc, etc., metals containing additives such as stainless steel and alloys. Among them, gold, silver, copper, nickel and aluminum are preferable, and copper and aluminum are more preferable. The thickness of the metallic foil is preferably 1 to 1000 μm, and more preferably 5 to 1000 μm.

The film which consists of a liquid-crystal polyester resin composition in the present invention has a good adherence with a metallic foil. Although it can preferably be adhered by heat-press bonding, an adhesive layer can be interposed between a liquid-crystal polyester resin composition layer and a metallic foil layer.

As such an adhesive, a hot-melt adhesive, a polyurethane adhesive, a 2-liquid reaction type polyester adhesive, etc. can be illustrated.

Heat-press bonding can be performed by using a press machine or a heating roll at a temperature near the flow temperature of a liquid-crystal polyester resin composition, and it is simple and preferable.

Surface treatment can be performed to the film which consists of a liquid-crystal polyester resin composition and the metallic foil used in the present invention, if necessary. As the surface-treatment method, for example, corona-discharge treatment, plasma treatment, flame treatment, infrared-radiation treatment, ultraviolet-radiation treatment, polishing treatment, sputtering treatment and solvent treatment are mentioned.

The method of manufacturing the laminate in the present invention is not especially limited. For example, a liquid-crystal polyester resin composition film obtained by inflation-molding or T-die extruding etc. and a metallic foil are heat-press bonded by using a heat roll or a pressing machine to obtain a laminate thereof. As another example, a molten liquid-crystal polyester resin composition is coated on a metallic foil using a T-die etc.

The laminate composed of the liquid crystal polyester resin composition layer(I) and the metallic foil layer(II) in the present invention may be a two-layered laminate composed of the layer(I) and the layer(II), a three-layered laminate composed of the layer(I) and two layers of the layer(II) sandwiching the layer(I), and a four or more-layered laminate jog composed of a plurality of the layer(I) and the layer(II) which are alternately laminated, and further laminated structures are possible.

The laminate obtained by the present invention is Hi suitable as a printed-wiring board and the like. When used as a printed-wiring board, copper foil is preferably used as the metallic foil.

The fiber material used in the present invention generally has role to reinforce strength of a film or a laminate, and an inorganic fiber material or an organic fiber material can be used. The thickness of the fiber material in the present invention is usually from 5 to 1000 μm, preferably from 10 to 500 μm.

Specific examples of the inorganic fiber material include glass fiber, quart fiber, carbon fiber, alumina fiber, stainless fiber, titanium fiber, boron fiber and the like, and a mixture thereof may also be used. Among them, glass fiber which has high strength and is cheap is preferred. Specific examples of the organic fiber material include Aramid fiber, polyamide fiber, liquid crystal polyester fiber and the like, and a mixture thereof may also be used. In the present invention, an organic fiber material having high elastic modulus is preferably used for obtaining a light-weight laminate.

For improving adhesion of the organic fiber material with the thermosetting resin described later, surface treatment can be performed on the organic fiber material. Examples of such as surface treatment include corona discharge treatment, plasma treatment, electric beam radiation treatment, solvent treatment or the like.

The fiber material is preferably used in the form of fiber, non-woven fabric and the like in view of handling, and more preferably used in the form of fiber.

In the present invention, such a fiber material can be used without any treatment as a constituent component, however, such a fiber material can also be impregnated with a thermosetting resin such as an epoxy resin, phenol resin, polyester resin, acrylic resin, polyimide resin, bismaleimide triazine resin and the like, and used as a prepreg.

Among them, the epoxy resin is preferably used in view of excellent mechanical property, heat resistance and the like, and further low cost. As the epoxy resin, known resins can be used, and there may be listed bifunctional epoxy resins, polyfunctional epoxy resins, for example, glycidyl ether of bisphenol A, glycidyl ether of phenol novolak, glycidyl ether of cresol novolak, maleimide resin, cyanate resin and the like.

In the present invention, the method for impregnating a fiber material with a thermosetting resin and producing a prepreg can be a known method, and a method in which a thermosetting resin is dissolved in a solvent and a fiber material is impregnated with the resulted solution and dried, a method in which a fiber material is impregnated with a thermosetting resin under heat and pressure without using a solvent, and the like. Regarding the proportion of the thermosetting resin to the fiber material, the proportion of the fiber material is preferably from 10 to 90% by weight. The laminate comprising a layer made of the above-described liquid crystal polyester resin composition and a layer made of a fiber material containing an organic fiber material and/or an inorganic fiber material can be formed by previously producing a film or sheet made of the liquid crystal polyester resin composition and heating and pressuring the film or sheet and the fiber material.

The condition for heating and pressuring the film or sheet made of the liquid crystal polyester resin composition and the layer made of the fiber material is not particularly restricted, and can be suitably selected according the properties of the film or sheet and the fiber material.

For obtaining the laminate comprising the layer made of the liquid crystal polyester resin composition and the layer made of the fiber material, a method can also be used in which the liquid crystal polyester resin composition is melt-extruded through a T die onto the fiber material layer, then they are press-bonded by roll and the like. For melt-extruding the liquid crystal polyester resin composition through a T-die, the same conditions as for the above-described T-die method can be applied.

Specifically, there is listed an embodiment in which the liquid crystal polyester resin composition melt-extruded by an extruder is usually formed into a sheet-shaped melted body through a T die directed to lower direction, and laminated on fiber or non-woven fabric made of a fiber material continuously supplied through a roll, then wound in longitudinal direction by a drawing apparatus through a press-bonding roll.

The fiber material is used in the form of textile, non-woven fabric and the like in view of handling, and the textile is further preferable. The thickness of the textile or non-woven fabric made of the fiber material in the present invention is usually from 5 to 1000 µm, preferably from 10 to 500 µm.

The thickness of the liquid crystal polyester can be controlled in the range of 3 to 1000 µm, and that in-the range of 3 to 200 µm is practically often used and preferable. The draft ratio of the liquid crystal polyester resin composition of the present invention is in the range of 1.1 to 40.0.

The film-forming temperature is preferably from the flow temperature of the liquid crystal polyester resin composition of the present invention minus 60° C. to the flow temperature of the liquid crystal polyester resin composition of the present invention plus 60° C., and more preferably, the film-forming processing is conducted in the temperature range from the flow temperature to the flow temperature plus 30° C.

The die gap of the T die is preferably from 0.2 mm to 1.5 mm. The drawing ratio is suitably determined according to the molding method, and for example, if the drawing ratio is defined as (length after drawing/original length), the drawing ratio in MD drawing direction is 1.2 to 20.0, and preferably 1.5 to 5.0. When the drawing ratio is lower than 1.2, tensile properties sometimes may lower, and when over 20.0, smoothness of the film sometimes is insufficient.

For obtaining the laminate comprising a metallic foil, a layer made of a liquid crystal polyester resin composition and a layer made of a fiber material, the metallic foil is laminated on the laminate comprising the layer made of the liquid crystal polyester resin composition and the layer made of the fiber material obtained by the above-described method, and they are heated and pressed (heat press-bonding). Further, the metallic foil, the film made of the liquid crystal polyester resin composition previously produced, and the fiber material are laminated, and they are heated and pressed (heat press-bonding) at once, to obtain a laminate. It is simple and preferred to conduct the heat press-bonding by a press machine or pressure roll around the flow temperature of the liquid crystal polyester resin composition.

As a method for producing the laminate comprising the metallic foil, the layer made of the liquid crystal polyester resin composition and the layer made of the fiber material of the present invention, there is also listed a method in which the liquid crystal polyester resin composition is melt-extruded from a T die and laminated onto the metallic foil, and textile or non-woven fabric made of the fiber material continuously supplied through a roll, and they are press-bonded by a roll and the like. Preferably, there is a method in which the liquid crystal polyester resin composition is melt-extruded between the textile or non-woven fabric made of the fiber material continuously supplied through a roll, and the metallic foil, and the resulted laminate is press-bonded by a roll and the like.

The laminate comprising the metallic foil, the layer made of the liquid crystal polyester resin composition and the layer made of the fiber material of the present invention may have structure in which an adhesive layer is inserted between the liquid crystal polyester film and the metallic foil according to commercial requirements. As specific examples of such an adhesive layer, a hot melt adhesive, polyurethane adhesive and the like can be exemplified. Among them, an epoxy group-containing ethylene copolymer and the like are preferably used.

The laminate comprising the metallic foil, the layer made of the liquid crystal polyester resin composition and the layer made of the fiber material is suitable as a multi-layered substrate, and is a three or more-layered laminate comprising the layer made of the fiber material, the layer made of the liquid crystal polyester resin composition and the metallic foil. For example, a three-layered structure comprising the layer made of an inorganic fiber material, the layer made of the above-described composition and the metallic foil, a five-layered structure in which the layer made of the above-described composition and the layer made of the fiber material are laminated on both surface of the metallic foil, or a six or more-layered structure in which the layer made of the fiber material, the layer made of the above-described composition and the metallic foil may possible be alternately laminated. Further, a layered structure in which an adhesive layer is inserted between respective interlayer spaces or some spaces between the layer made of the fiber material, the layer made of the liquid crystal polyester resin composition and the metallic foil, is also possible. The adhesive layer may be an adhesive film previously produced, or may be melt-extruded or sprayed between the layers using a T die, coater and the like.

Examples of the structure of the laminate of the present invention include many combination of the fiber material ①, the liquid crystal polyester resin composition ② and the metallic foil ③, for example, ①/②, ②/①/②, ③/②/①/②/③, ③/②/①/②/③/②/① and the like The laminate obtained in the present invention has low dielectric constant, dielectric loss tangent and water absorption, and further is cheap, and can be suitably used as a multi-layered substrate.

Hereinafter the present invention will be further explained with reference to examples. However, these examples are for presenting some embodiments, and thus the present invention is not limited thereto.

(1) A liquid crystal polyester as the component (A)

(i) 10.8 kg (60 mole) of p-acetoxybenzoic acid, 2.49 kg (15 mole) of terephthalic acid, 0.83 kg (5 mole) of isophthalic acid and 5.45 kg (20.2 mole) of 4,4'-diacetoxydiphenyl were placed in a polymerization vessel having a comb-like kneading blade. The temperature in the vessel was increased while kneading under a nitrogen gas atmosphere. And polymerization was conducted for one hour at 330° C. with a strong kneading while removing acetic acid generated as a side product. Afterwards, the vessel was gradually cooled and at 200° C. the obtained polymer was taken out from the vessel. The obtained polymer was pulverized with a hammer mill produced by Hosokawa Micron Co., Ltd. to have particles of 2.5 mm or smaller. Furthermore, by treating the particles in a rotary kiln in a nitrogen gas atmosphere for three hours at 280° C., wholly aromatic polyester particles comprising the below-mentioned repeating unit with a flowing temperature of 324° C. were obtained.

A flowing temperature here denotes a temperature at which a melt viscosity of 48,000 poise is obtained when a resin heated with a temperature increase rate of 4° C/minute is extruded from a nozzle having an inner diameter of 1 mm and a length of 10 mm under a load of 100 kgf/cm2 measured with a Koka flow tester type CFT-500 produced by Shimadzu Co., Ltd.

Hereinafter the liquid crystal polyester is referred to as A-1. The polymer showed an optical anisotropy at 340° C. or higher under load. The repeating unit of the liquid crystal polyester A-1 is as shown below:

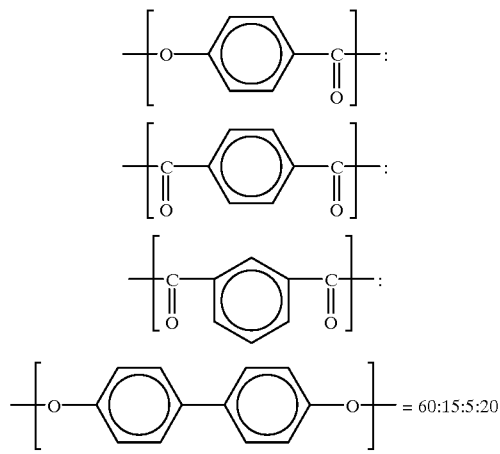

(ii) 16.6 kg (12.1 mole) of p-hydroxybenzoic acid, 8.4 kg (4.5 mole) of 6-hydroxy-2-naphthoic acid and 18.6 kg (18.2 mole) of acetic anhydride. were placed in a polymerization vessel having a comb-like kneading blade. The temperature in the vessel was increased while kneading under a nitrogen gas atmosphere. And polymerization was conducted for one hour at 320° C., and further for one hour at 320° C. under a reduced pressure of 2.0 torr while discharging acetic acid generated as a side product to outside the vessel. Afterwards, the vessel was gradually cooled and at 180° C. the obtained polymer was taken out from the vessel.

The obtained polymer was pulverized similarly as the above-mentioned (i). Furthermore, by treating the particles in a rotary kiln in a nitrogen gas atmosphere for five hours at 240° C., wholly aromatic polyester particles comprising the below-mentioned repeating unit with a flowing temperature of 270° C. were obtained. Hereinafter the liquid crystal polyester is referred to as A-2. The polymer showed an optical anisotropy at 280° C. or higher under load. The repeating unit of the liquid crystal polyester A-2 is as shown below:

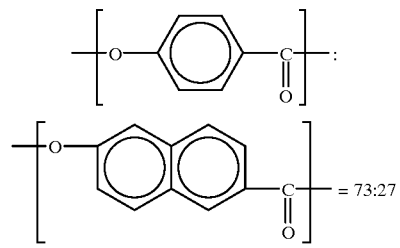

(2) rubber of component (B):

The Mooney viscosity here refers to the value measured with a large rotor at 100° C. according to the JIS K6300. MI is a melt index (g/10 min) at 190° C. according to JIS K6791.

(i) According to the method disclosed in Example 5 of JP-A-61-127709, a rubber comprising methyl acrylate/ethylene/glycidyl methacrylate=59.0/38.7/2.3 (weight ratio) having a Mooney viscosity of 15 and MI of 9 was produced. The heat of fusion measured using DSC with temperature increasing from −150 to 100° C. was less than 1 J/g. Hereinafter the rubber is referred to as B-1.

(ii) According to the method disclosed in Example 5 of JP-A-61-127709, a rubber comprising methyl acrylate/ethylene/glycidyl methacrylate=56.0/40.7/3.3 (weight ratio) having a Mooney viscosity of 12 and MI of 12 was produced. The heat of fusion was less than 1 J/g. Hereinafter the rubber is referred to as B-2.

(3) Method for measuring film physical properties

Film appearance: film appearance was evaluated according to the criteria described below.

○: unevenness and warpage are scarcely recognized on film

×: unevenness and warpage are recognized on film (4) Method for measuring physical properties of laminate Dielectric constant and dielectric loss tangent: LCR meter 4275A type apparatus manufactured by Yokogawa Hewlett Packard Corp. was used, and measurement was conducted at a frequency of 1 kHz.

Interlayer peeling strength: The interlayer peeling strength between layers was measured at a speed of 50 m/min, by 180° direction pealing method according to JPCA standard.

Bending test: Laminates were cut out from a liquid crystal polyester resin composition layer in MD direction and TD direction, and the respective laminates were subjected to bending test using MIT bending tester Folding Endrance Tester MIT-D type manufactured by Toyo Seiki Corp., at a load of 1 kgf, a bending angle of 135°, a curvature radius of bending surface of 2 mm, a bending speed of 175 times/min according to JIS-p-8115, and number of bending until the laminate was decomposed was measured.

EXAMPLES 1, 2

Respective components were mixed by a Henschel mixer at w a mixing ratio shown in Table 1, and the mixture was melt- extruded using TEX-30 type twin-screw extruder manufactured by Japan Steel Works, Co. Ltd. under condition shown in Table 1, to obtain a composition. A pellet of this composition was melt-extruded using a 60 mm φ single-screw extruder equipped with a circular die under condition shown in Table 2, the molten resin was extruded toward upper direction through a circular die having a diameter of 50 mm, a die gap of 1.0 mm at a die set temperature of 348° C., dry air was injected into hollow part to inflate a tubular film, then, the film was cooled before it was drawn at a drawing speed of 23 m/min through a nip roll, to obtain a liquid crystal polyester resin composition film. Drawing ratio and blow ratio in film MD direction are shown in Table 2. A two-liquid reaction type adhesive AD-503 manufactured by Toyo Morton Corp. was applied on the resulting film, and the solvent was dried, then, electrolyzed copper foil having a thickness of 18 μm was laminated, and they were press-bonded with heating to obtain a laminate. The physical properties of the laminate are shown in Table 3.

COMPARATIVE EXAMPLE 1

The same procedure as in Examples 1, 2 was conducted for trying to form a film except that only a liquid crystal polyester A-1 was used instead of the above-described composition, however, no film was obtained (Tables 1 to 2).

COMPARATIVE EXAMPLE 2

The same procedure as in Examples 2 was conducted for forming a film except that Bond Fast 2C (copolymer in which ethylene/glycidyl methacrylate=94/6 by weight) manufactured by Sumitomo Chemical Co., Ltd. was used instead of B-2 in Example 2, however, no film was obtained (Tables 1 to 2). Then a laminate was obtained in the same manner as in Example 2, however, interlayer peeling strength was insufficient as shown in Table 3.

EXAMPLE 3

Melt-kneading was conducted in the same manner as in Examples 1, 2 except that the melt-kneading conditions were changed as shown in Table 1, then, inflation film forming was conducted in the same manner as in Examples 1, 2 except that the inflation film forming conditions were changed as shown in Table 2, to obtain a film. An adhesive film 7B-403 (thickness 50 μm) manufactured by Sumitomo Chemical Co., Ltd. was laminated onto the resulting film, drawn copper having a thickness of 18 μm was further laminated on the adhesive film, and the laminated composite was passed through a heat roll to obtain a laminate. The resulted laminate had physical properties as shown in Table 3.

COMPARATIVE EXAMPLE 3

The same procedure as in Example 3 was conducted for trying to effect inflation film forming except that component formulation was changed as shown in Table 1 or 2, however, no excellent film was obtained.

TABLE 1

| | Composition (% by weight) | | | Melt-kneading condition | |
|---|---|---|---|---|---|
| | | | | Cylinder set temperature | Screw rotation rate |
| | (A) | (B) | Others | (° C.) | (rpm) |
| Example 1 | A-1 88 | B-1 12 | 0 | 348 | 190 |
| Example 2 | A-1 66 | B-1 34 | 0 | 348 | 190 |
| Comparative example 1 | A-1 100 | 0 | 0 | 348 | 190 |
| Comparative example 2 | A-1 66 | 0 | * 1 34 | 348 | 190 |
| Example 3 | A-2 92 | B-2 8 | 0 | 286 | 190 |
| Comparative example 3 | A-2 92 | 0 | * 2 8 | 286 | 190 |

* 1: Bond Fast 2C manufactured by Sumitomo Chemical Co., Ltd. (copolymer in which ethylene/glycidyl methacrylate = 94/6 by weight, MFR (190° C., 2.16 kg load) = 3 g/10 min, stiffness = 1000 kg/cm$^2$)
* 2: EVA polymer NUC-3808 manufactured by Nippon Unicar Corp. (copolymer in which ethylene/vinyl acetate = 94/6 by weight, MFR (190° C., 2.16 kg load) = 8 g/10 min, stiffness = 750 kg/cm$^2$)

TABLE 2

| | Inflation film forming condition | | | | | Film physical properties | |
|---|---|---|---|---|---|---|---|
| | Cylinder set temperature (° C.) | Screw rotation rate (rpm) | Die set temperature (° C.) | MD drawing ratio | Blow ratio | Thickness (μm) | Appearance |
| Example 1 | 348 | 80 | 348 | 7.1 | 4.9 | 9 | ○ |
| Example 2 | 348 | 80 | 348 | 4.7 | 3.1 | 31 | ○ |
| Comparative example 1 | 348 | 80 | 348 | Film forming impossible | | — | — |
| Comparative example 2 | 348 | 80 | 348 | 1.9 | 1.7 | 62 | x |
| Example 3 | 286 | 80 | 286 | 3.2 | 3.1 | 27 | ○ |
| Comparative example 3 | 286 | 80 | 286 | Film forming impossible | | — | — |

TABLE 3

| | Physical properties of laminated material | | | | |
|---|---|---|---|---|---|
| | Bending test (times) | | Interlayer peeling strength | Dielectric | Dielectric loss |
| | MD | TD | (kg/cm$^2$) | constant | tangent |
| Example 1 | >100000 | >100000 | 2.9 | 2.4 | 0.018 |
| Example 2 | >100000 | >100000 | 2.7 | 2.2 | 0.018 |
| Comparative example 1 | — | — | — | — | — |
| Comparative example 2 | >100000 | >100000 | 0.9 | 2.4 | 0.002 |
| Example 3 | >100000 | >100000 | 1.5 | 2.3 | 0.010 |
| Comparative example 3 | — | — | — | — | — |

EXAMPLE 4

Respective components were mixed using a Henschel mixer at a mixing ratio shown in Table 4, and the mixture was melt-extruded using TEX-30 type twin-screw extruder manufactured by Japan Steel Works, Co. Ltd. under conditions shown in Table 4, to obtain pellets. Using an apparatus schematically shown in FIG. 1, a laminate was obtained as follows. The pellets were melt-extruded to form a film through a T die (1) having die gap of 1.2 mm, die width of 400 mm at a die set temperature of 290° C. onto electrolyzed copper foil (3) having a thickness of 18 μm fed out from a roll, the both layers were press-bonded by passing through a roll (4) at a roll set temperature of 170° C., then wound on a winding roll (6) via a roll (5). The resin composition layer in the resulting laminate had a thickness of 53 μm. The resulting laminate had excellent appearance, and no peeling was recognized. The physical properties of the laminate are shown in Table 4.

COMPARATIVE EXAMPLE 4

The melt-kneading was conducted in the same conditions as in Examples 4 except that A-2 was used instead of the composition in Example 4, and the resulted pellet was melt-extruded through the T die in the same conditions as in Example 4. Unevennes in thickness and warpage of A-2 layer were remarkable, and therefore, peeling occurred between A-2 layer and the electrolyzed copper foil and excellent laminate was not obtained.

a frequency of 1 kHz, using LCR meter 4275A type apparatus manufactured by Yokogawa Heulett Packard Corp.

Film formation using a liquid crystal polyester resin composition

Respective components were mixed using a Henschel mixer at a mixing ratio shown in Table 5, and the mixture was melt-extruded using TEX-30 type twin-screw extruder manufactured by Japan Steel Works, Co. Ltd. under condition shown in Table 5, to obtain a composition. The pellet of this composition was melt-extruded using a 60 mm ϕ single-screw extruder equipped with a circular die under conditions shown in Table 5, the molten resin was extruded toward upper direction through a circular die having a diameter of 60 mm, a die gap of 1.5 mm under conditions shown in Table 5, dry air was injected into hollow part of this tublar film to inflate the tublar film, then, the film was cooled before passing through a nip roll to obtain a liquid crystal polyester resin composition film. Drawing ratio in drawing direction (MD direction) of this liquid crystal polyester resin

TABLE 4

| | Composition (% by weight) | | Melt-kneading conditions | | Physical properties of laminated material | | | | |
|---|---|---|---|---|---|---|---|---|---|
| | | | Cylinder set temperature | Screw rotation rate | Bending test (times) | | Interlayer peeling strength | Dielectric constant | Dielectric loss tangent |
| | (A) | (B) | (° C.) | (rpm) | MD | TD | (kg/cm$^2$) | | |
| Example 4 | A-2 77 | B-1 23 | 286 | 190 | >100000 | >100000 | 1.2 | 2.4 | 0.009 |
| Comparative example 4 | A-2 100 | 0 | 286 | 190 | Molding impossible | | | | |

The following examples were conducted according to the conditions described below.

Measurement of dielectric constant and dielectric loss tangent: A gold electrode was vapor-deposited on both surfaces of the sample, and measurement was conducted at composition film, and in direction perpendicular to the drawing direction (TD direction) were controlled by the amount of dry air to be injected and the film drawing speed. In this procedure, blow ratio in TD direction and drawing ratio in MD direction are shown in Table 5. Sample No. and thickness of the resulting liquid crystal polyester resin composition film are shown in Table 5.

TABLE 5

| | Composition (% by weight) | | Melt-kneading conditions | | Film molding condition | | | | |
|---|---|---|---|---|---|---|---|---|---|
| | | | Cylinder set temperature | Screw rotation rate | Cylinder set temperature | Screw rotation rate | MD | TD Blow ratio | Film thickness |
| | (A) | (B) | (° C.) | (rpm) | (° C.) | (rpm) | Drawing ratio | | (μm) |
| F-1 | A-1 86 | B-1 14 | 350 | 200 | 350 | 80 | 3.9 | 4.5 | 48 |
| F-2 | A-1 100 | 0 | 350 | 200 | 350 | 80 | Film forming impossible | — | — |
| F-3 | A-2 67 | B-1 33 | 293 | 200 | 290 | 60 | 5.2 | 5.9 | 18 |
| F-5 | A-2 100 | 0 | 293 | 200 | 290 | 60 | Film forming impossible | — | — |

EXAMPLE 5

TYPE 181 untreated glass fabric was immersed into a mixture prepared by adding 5.4 parts by weight of a curing agent dicyanamide and 0.2 parts by weight of a catalyst 2-ethyl-4-methylimidazole to 100 parts by weight of novolak type epoxy resin ESCN-195 manufactured by Sumitomo Chemical Co. Ltd. as en epoxy resin, so that glass content was 62% by weight, then heat treatment was conducted at 200° C. for 3 hours under reduced pressure for curing the epoxy resin, to obtain cloth made of glass fiber having thickness of 40 $\mu$m. Resin film F-1, Permatack AW-060 (epoxy resin manufactured by Kyodo Yakuhin Corp.) and electrolyzed copper foil having a thickness of 35 $\mu$m were respectively laminated on the both surfaces of the cloth made of glass fabric, the resulted laminate was dried to removed solvent in Permatack AW-060, then, it was pressed such molding conditions as a temperature of 330° C., a pressure of 90 kg/cm$^2$, and a treating time of 20 minutes. The resulted laminate had a dielectric loss tangent of 0.007 and a relative dielectric constant of 2.5.

COMPARATIVE EXAMPLE 5

A laminate was obtained in the same manner as in Example 5 except that resin film F-1 was not used. The resulting laminate had a dielectric loss tangent of 0.030 and a relative dielectric constant of 4.3.

EXAMPLE 6

Carbon fiber woven fabric W-3121 (trade name) manufactured by Toho Besron Corp. was immersed into a mixture prepared by adding 127 parts by weight of terminal functional imideoligomer SM-20 (trade name) manufactured by Sumitomo Chemical Co., Ltd. to 100 parts by weight of Sumiepoxy ELA-128 (trade name) for general purpose epoxy resin manufactured by Sumitomo Chemical Co., Ltd., then the resin was cured by heating at 200° C. for 45 minutes, to obtain a sheet having a thickness of 90 $\mu$m. The amount of the carbon fiber was 39% by weight. Between F-3 films of which four layers were laminated, three pieces of the above resulting sheets were inserted so that each one sheet was sandwiched between resin films, and further, electrolyzed copper foil having a thickness of 18 $\mu$m was laminated on the outermost resin film F-3, and the laminated composite was subjected to press molding under conditions including a temperature of 250° C., a pressure of 120 kg/cm$^2$, and a treating time of 30 minutes, to obtain a 9-layered laminate. This laminate had a dielectric loss tangent of 0.005 and a relative dielectric constant of 2.5.

Then, respective components were mixed with Henschel mixer according to composition as shown in Table 6, and the mixture was melt-extruded using TEX-30 type twin-screw extruder manufactured by Japan Steel Works, Co. Ltd. under conditions shown in Table 6.

TABLE 6

| No. | Composition (% by weight) | | | Cylinder set temperature (° C.) | Screw rotation rate (rpm) |
| --- | --- | --- | --- | --- | --- |
| | Component A | Component B | Other component | | |
| L-1 | A-1 69 | B-1 31 | 0 | 354 | 180 |
| L-2 | A-1 100 | 0 | 0 | 354 | 180 |
| L-4 | A-2 100 | 0 | 0 | 305 | 180 |

TABLE 6-continued

| No. | Composition (% by weight) | | | Cylinder set temperature (° C.) | Screw rotation rate (rpm) |
| --- | --- | --- | --- | --- | --- |
| | Component A | Component B | Other component | | |
| L-5 | A-2 88 | 0 | *1 12 | 305 | 180 |

*1: Polyethylene manufactured by Sumitomo Chemical Co., Ltd. trade name: Sumikathen F 1103 (MFR = 0.5 g/10 min, Stiffness = 1300 kg/cm$^2$)

EXAMPLE 7

Figure 2:
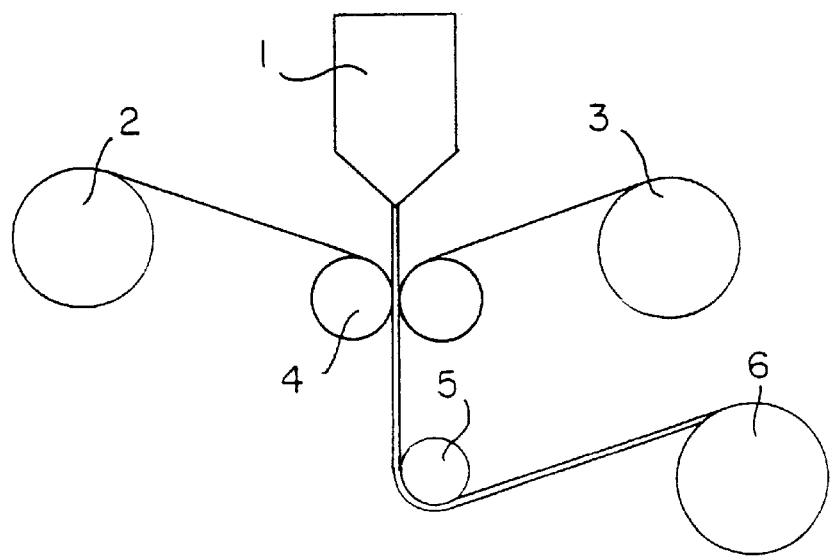
FIG. 2 is a schematic view of the apparatus used in Example 7.

Using an apparatus shown in FIG. 2, glass plain woven fabric having a thickness of 0.1 mm (KS 1220 manufactured by Kanebo, Ltd.)(2) was fed at a speed of 2 m/min from a feeding roll and electrolyzed copper foil (3) having a thickness of 25 $\mu$m was fed at a speed of 2 m/min from another feeding roll. On the other hand, a liquid crystal polyester resin composition L-1 was melt-extruded from a T die (1) having a lip length of 400 mm, a die gap of 0.8 mm at a die set temperature of 352° C. into between the glass plain woven fabric and the electrolyzed copper foil as shown in FIG. 2, the resulted composite was passed through a heating roll (4) set at 310° C., then wound on a winding roll (6) at a speed of 2 m/min, to obtain a laminate comprising glass plain woven fabric/L-1 (thickness 42 $\mu$m)/electrolyzed copper foil. The resulting laminated had excellent appearance, and void and interfacial peeling between the layers were not recognized. The laminate had a dielectric loss tangent of 0.006 and a relative dielectric constant of 2.3.

COMPARATIVE EXAMPLE 6

Investigation was performed under the same conditions as in Example 7 except that the liquid crystal polyester resin A-1 was used instead of the liquid crystal polyester resin L-1. A-1 layer had remarkable unevenness in thickness and interlayer peeling occurred between the glass plain woven fabric and A-1 and between the electrolyzed copper foil and A-1, and excellent laminate could not obtained.

COMPARATIVE EXAMPLE 7

Woven fabric having a thickness of 0.8 mm(mark 2 in FIG. 2) produced by plain weaving of monofilament having 1100 dtex of Aramid fiber Twaron 1000 (trade name) manufactured by Nippon Aramid Corp. was fed at a speed of 3 m/min from a feeding roll and electrolyzed copper foil (mark 3 in FIG. 3) having a thickness of 18 a m was fed at a speed of 3 m/min from another feeding roll, using an apparatus shown in FIG. 2, a liquid crystal polyester resin composition L-4 was melt-extruded from a T die (mark 1 in FIG. 2) having a lip length of 400 mm, a die gap of 1.1 mm at a die set temperature of 308° C. as shown in FIG. 2, the resulted composite was passed through a heating roll (mark 4 in FIG. 2) set at 280° C., then wound on a winding roll (mark 6 in FIG. 2) at a speed of 3 m/min, to obtain a laminate comprising Aramid fiber woven fabric/L-4 (thickness 28 $\mu$m)/electrolyzed copper foil. L-4 layer had remarkable unevenness in thickness and interlayer peeling occurred between respective layers, and excellent laminate was not obtained.

COMPARATIVE EXAMPLE 8

Investigation was performed under the same conditions as in Example 2 except that the liquid crystal polyester resin L-5 was used instead of L-4. L-5 layer had a lot of voids formed in the layer, and remarkable unevenness in thickness, and excellent laminate was not obtained.

The resin composition used in the present invention has excellent heat resistance and film forming processability, reveals excellent adhesion with a metallic foil, and the laminate composed of the resin composition film and the metallic foil of the present invention has excellent flexibility and electric properties, and is cheap, therefore, suitable as a printed-wiring board.

The laminate comprising a metallic foil, a layer made of a liquid crystal polyester resin composition and a layer made of a fiber material of the present invention has excellent heat resistance and low relative dielectric constant and low dielectric loss tangent, has excellent appearance, and further, the laminate can be produced in industrially inexpensive and simple manner. The laminate can be used widely in the industrial field as electric and electronic parts, precision parts and the like, utilizing these merits.

What is claimed is:

1. A laminate comprising a metallic foil and a layer made of a liquid crystal polyester resin composition comprising a liquid crystal polyester(A) as a continuous phase and rubber (B) having a functional group reactive with the liquid crystal polyester as a dispersed phase.

2. A laminate comprising a layer made of a liquid crystal polyester resin composition comprising a liquid crystal polyester(A) as a continuous phase and rubber(B) having a functional group reactive with the liquid crystal polyester as a dispersed phase, and a layer made of a fiber material containing an organic fiber material and/or an inorganic fiber material.

3. A laminate comprising a metallic foil, a layer made of a liquid crystal polyester resin composition and a layer made of a fiber material containing an organic fiber material and/or inorganic fiber material in this order, wherein said liquid crystal polyester resin composition comprises a liquid crystal polyester(A) as a continuous phase and a rubber(B) having a functional group reactive with the liquid crystal polyester as a dispersed phase.

4. The laminate according to claim 1 or 2, wherein the liquid crystal polyester resin composition comprises 56.0 to 99.9% by weight of a liquid crystal polyester(A), and 44.0 to 0.1% by weight of rubber(B) having a functional group reactive with the liquid crystal polyester.

5. The laminate according to claim 4, wherein the functional group reactive with the liquid crystal polyester is an oxazolyl group, epoxy group or amino group.

6. The laminate according to claim 4, wherein the functional group reactive with the liquid crystal polyester is an epoxy group.

7. The laminate according to claim 4, wherein rubber(B) having a functional group reactive with the liquid crystal polyester is a copolymer containing an unsaturated glycidyl carboxylate unit and/or an unsaturated glycidyl ether unit.

8. The laminate according to claim 4, wherein rubber(B) having a functional group reactive with the liquid crystal polyester is composed of a (meth)acrylate-ethylene-(unsaturated glycidyl carboxylate and/or unsaturated glycidyl ether) copolymer rubber.

9. The laminate according to claim 8, wherein rubber(B) having a functional group reactive with the liquid crystal polyester is a copolymer comprising 40 to 97% by weight of a (meth)acrylate unit, 3 to 50% by weight of an ethylene unit, and 0.1 to 30% by weight of an unsaturated glycidyl carboxylate unit and/or an unsaturated glycidyl ether unit.

10. The laminate according to claim 8, wherein the (meth)acrylate is at least one member selected from the group consisting of methyl acrylate, methyl methacrylate, n-butyl acrylate, n-butyl methacrylate, tert-butyl acrylate, tert-butyl methacrylate, 2-ethylhexyl acrylate and 2-ethylhexyl methacrylate.

11. The laminate according to claim 4, wherein rubber(B) having a functional group reactive with the liquid crystal polyester is a copolymer having a heat of fusion of the crystal of less than 6 J/g.

12. The laminate according to claim 4, wherein rubber(B) having a functional group reactive with the liquid crystal polyester has a Mooney viscosity of 3 to 70, where, the Mooney viscosity is a value measured by using a large rotor at 100° C. according to JIS K6300.

13. The laminate according to claim 1 or 3, wherein the metallic foil is selected from the group consisting of gold, silver, copper, nickel and aluminum.

14. The laminate according to claim 1 or 3, wherein the metallic foil is copper foil.

15. The laminate according to claim 1 or 3, wherein an adhesive layer is inserted between the metallic foil and the film made of the liquid crystal polyester resin composition.

16. A printed wiring substrate composed of the laminate of claim 1 or 3.

17. The laminate according to claim 2 or 3, wherein the inorganic fiber material is at least one member selected from the group consisting of glass fiber, quartz fiber, carbon fiber, alumina fiber, stainless fiber, titanium fiber and boron fiber.

18. The laminate according to claim 2 or 3, wherein the organic fiber material is at least one member selected from the group consisting of Aramid fiber, polyamide fiber and liquid crystal polyester fiber.

19. The laminate according to claim 2 or 3, wherein the layer of the fiber material is a textile or a non-woven fabric.

20. A multi-layered substrate composed of the laminate of claim 3.

21. A process for producing a laminate wherein a liquid crystal polyester resin composition comprising a liquid crystal polyester(A) as a continuous phase and rubber(B) having a functional group reactive with the liquid crystal polyester as a dispersed phase is melt-extruded through a T die to be laminated and pressed on textile or non-woven fabric made of a fiber material containing an organic fiber material and/or an inorganic fiber material, and a metallic foil, which are continuously supplied through a roll.

* * * * *